US010547277B2

(12) United States Patent
Rocca et al.

(10) Patent No.: US 10,547,277 B2
(45) Date of Patent: Jan. 28, 2020

(54) MEMS CAPACITIVE SENSOR

(71) Applicant: TDK Corporation, Tokyo (JP)

(72) Inventors: Gino Rocca, Copenhagen (DK);
Tomasz Hanzlik, Szczecin (PL)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/063,987

(22) PCT Filed: Dec. 21, 2015

(86) PCT No.: PCT/EP2015/080860
§ 371 (c)(1),
(2) Date: Jun. 19, 2018

(87) PCT Pub. No.: WO2017/108083
PCT Pub. Date: Jun. 29, 2017

(65) Prior Publication Data
US 2019/0207569 A1 Jul. 4, 2019

(51) Int. Cl.
*H04R 3/00* (2006.01)
*H04R 19/00* (2006.01)
(Continued)

(52) U.S. Cl.
CPC .............. *H03F 3/185* (2013.01); *H04R 3/00* (2013.01); *H04R 19/005* (2013.01); *H04R 19/04* (2013.01); *H03F 2200/03* (2013.01)

(58) Field of Classification Search
CPC . H04R 3/00; H04R 1/04; H04R 19/04; H04R 19/004; H04R 19/005; H04R 29/00;
(Continued)

(56) References Cited

U.S. PATENT DOCUMENTS

2007/0009111 A1* 1/2007 Stenberg .................. H04R 3/06
381/113
2009/0322353 A1 12/2009 Ungaretti et al.
(Continued)

FOREIGN PATENT DOCUMENTS

EP    1742506 A2    1/2007
EP    1988366 A1    11/2008

OTHER PUBLICATIONS

Jawed, S., et al., "A MEMS Microphone Interface with Force-Balancing and Charge-Control," Conference: Research in Microelectronics and Electronics; IEEE; Jun. 22, 2008, pp. 97-100.

*Primary Examiner* — Thang V Tran
(74) *Attorney, Agent, or Firm* — Slater Matsil, LLP

(57) ABSTRACT

A MEMS capacitive sensor is disclosed. In an embodiment a MEMS capacitive sensor includes a capacitor having a variable capacitance, wherein the capacitor includes a backplate and a membrane being separated from each other by a variable distance, wherein the capacitor is arranged on a substrate, an output terminal configured to provide an output signal, wherein the output terminal is connected to the backplate, a bias voltage input terminal configured to apply a bias voltage, wherein the bias voltage input terminal is connected to the membrane and a supply voltage input terminal configured to apply a supply voltage, wherein the supply voltage input terminal is connected to the substrate, wherein the MEMS capacitive sensor is configured to generate a level of the output signal in dependence on the distance between the membrane and the backplate.

15 Claims, 3 Drawing Sheets

(51) Int. Cl.
 *B81B 7/00* (2006.01)
 *H03F 3/185* (2006.01)
 *H04R 19/04* (2006.01)

(58) Field of Classification Search
 CPC ............ H04R 29/004; H04R 2201/003; H04R 31/003; B81B 7/00; B81B 7/008; H01L 2924/1461; H03F 3/183; H03F 3/185; H03F 2200/03; H03F 2200/511
 See application file for complete search history.

(56) References Cited

U.S. PATENT DOCUMENTS

| | | | |
|---|---|---|---|
| 2010/0013501 A1* | 1/2010 | Van Den Boom | G01D 3/08 324/679 |
| 2010/0166228 A1* | 7/2010 | Steele | A61B 8/4444 381/113 |
| 2011/0142261 A1* | 6/2011 | Josefsson | H04R 3/00 381/107 |
| 2014/0177113 A1* | 6/2014 | Gueorguiev | H01L 27/0248 361/56 |
| 2014/0266260 A1* | 9/2014 | Wurzinger | G01R 27/2605 324/684 |
| 2015/0125003 A1 | 5/2015 | Wiesbauer et al. | |
| 2015/0131813 A1 | 5/2015 | Kim et al. | |
| 2015/0289046 A1* | 10/2015 | Dehe | H04R 1/08 381/111 |
| 2016/0029129 A1* | 1/2016 | Nicollini | H04R 19/04 381/113 |
| 2018/0152792 A1* | 5/2018 | Hoekstra | H04R 19/005 |

\* cited by examiner

MEMS CAPACITIVE SENSOR

This patent application is a national phase filing under section 371 of PCT/EP2015/080860, filed Dec. 21, 2015 and is incorporated herein by reference in its entirety.

TECHNICAL FIELD

A MEMS capacitive sensor using a variable capacitance to provide an output signal is disclosed. Furthermore, an arrangement for amplifying an output signal of a MEMS capacitive sensor is described.

BACKGROUND

An arrangement for amplifying an output signal of a MEMS capacitive sensor comprises the MEMS capacitive sensor and a signal processing circuit coupled to the MEMS capacitive sensor. The MEMS capacitive sensor may be configured as a MEMS microphone. The signal processing circuit is configured to provide a bias voltage for operating the MEMS capacitive sensor and to amplify the output signal of the MEMS capacitive sensor and to provide an amplified output signal. The bias voltage is used to bias a capacitor of the MEMS capacitive sensor having a variable capacitance.

The signal processing circuit, which may be configured as an ASIC signal processing circuit, may comprise an amplifier, for example, an inverting amplifier, a positive/negative bias voltage generator, for example, a bias voltage pump, to provide the bias voltage for the MEMS capacitive sensor and a large AC coupling capacitance being arranged in a signal path between an input terminal of the signal processing circuit coupled to an output terminal of the MEMS capacitive sensor to receive the output signal of the MEMS capacitive sensor and an amplifier to amplify the received output signal of the MEMS capacitive sensor.

The output signal provided at the output terminal of the MEMS capacitive sensor and received at the input terminal of the signal processing circuit may be taken from a backplate of the capacitor of the MEMS capacitive sensor. The backplate of the capacitor may be the side with the smallest parasitic capacitance. A membrane of the capacitor of the MEMS capacitive sensor may be connected to a "reference ground" of the amplifier of the signal processing circuit.

In a standard CMOS process, the AC coupling capacitance causes a certain loss of the signal from the backplate of the capacitor of the MEMS capacitive sensor because of an unavoidable parasitic capacitance between the backplate of the capacitor of the MEMS capacitive sensor and the bulk substrate of the signal processing circuit. One could use advanced (or expensive) processes which offer MiM capacitors options. In this case, the parasitic portion can be only a few percent, for example, 2%, of the capacitance value of the coupling capacitance. However, the parasitic effects deteriorate the output signal of the MEMS capacitive sensor received by the signal processing circuit, and, as a consequence, the SNR (signal to noise ratio) of the MEMS capacitive sensor, for example, the MEMS microphone is further worsened.

It is desired to provide a MEMS capacitive sensor that may be coupled to a signal processing circuit to provide a supply and bias voltage for the MEMS capacitive sensor and to amplify the output signal of the MEMS capacitive sensor, wherein the influence of parasitic effects to the amplification process of the output signal of the MEMS capacitive sensor is reduced. Furthermore, there is a desire to provide an arrangement for amplifying an output signal of a MEMS capacitive sensor, wherein the influence of parasitic effects to the amplification process of the output signal of the MEMS capacitive sensor is reduced.

SUMMARY OF THE INVENTION

In an embodiment a MEMS capacitive sensor that may be coupled to a signal processing circuit to provide a bias voltage for operating the MEMS capacitive sensor and an amplifier for amplifying an output signal of the MEMS capacitive sensor, wherein parasitic effects that might influence the amplification of the output signal of the MEMS capacitive sensor are reduced, is disclosed.

The MEMS capacitive sensor may comprise a capacitor having a variable capacitance, wherein the capacitor comprises a backplate and a membrane being separated from each other by a variable distance, wherein the capacitor is arranged on a substrate. The capacitive sensor comprises an output terminal to provide an output signal, wherein the output terminal is connected to the backplate. The capacitive sensor further comprises a bias voltage input terminal to apply a bias voltage. The bias voltage input terminal is connected to the membrane. The capacitive sensor comprises a supply voltage input terminal to apply a supply voltage. The supply voltage input terminal is connected to the substrate/bulk of the MEMS capacitive sensor. The MEMS capacitive sensor is configured to generate a level of the output signal in dependence on the distance between the membrane and the backplate.

In a further embodiment ann arrangement for amplifying the output signal of the MEMS capacitive sensor, wherein the influence of parasitic effects to the amplification process of the output signal of the MEMS capacitive sensor is reduced, is disclosed.

The arrangement may comprise a MEMS capacitive sensor as specified above and a signal processing circuit. The signal processing circuit has a supply voltage output terminal to provide the supply voltage for the MEMS capacitive sensor and a signal output terminal to provide an amplified output signal. The supply voltage output terminal of the signal processing circuit is connected to the supply voltage input terminal of the MEMS capacitive sensor. The signal processing circuit comprises an amplifier to amplify the output signal of the MEMS capacitive sensor and to provide the amplified output signal at the signal output terminal of the signal processing circuit. The amplifier of the signal processing circuit is arranged between the supply voltage output terminal and a reference terminal to apply a reference voltage.

The arrangement comprising the MEMS capacitive sensor and the signal processing circuit as described above may allow to provide an interfacing of the MEMS capacitive sensor and the signal processing circuit, involving the connection of three pins of the MEMS capacitive sensor, which offers advantages in terms of SNR (signal to noise ratio) performance of the MEMS capacitive sensor, for example, a MEMS microphone, and/or cost reduction of the signal processing circuit.

The membrane of the capacitor of the MEMS capacitive sensor may be connected to the bias voltage input terminal, for example, a bias pad, to apply the bias voltage for operating/biasing the capacitor of the MEMS capacitive sensor. The backplate of the capacitor of the MEMS capacitive sensor is coupled to the output terminal of the MEMS capacitive sensor/input terminal of the signal processing circuit, for example, an IN pad of the signal processing circuit. Furthermore, the bulk/substrate of the MEMS capacitive sensor is connected to the supply voltage input terminal of the MEMS capacitive sensor or the supply voltage output terminal of the signal processing circuit that is configured as AC ground for the amplifier of the signal processing circuit.

The embodiment of the signal processing circuit may allow to avoid the provision of a coupling capacitance on a signal path between a signal input terminal of the signal processing circuit to receive the output signal of the MEMS capacitive sensor and a control terminal of the amplifier of the signal processing circuit so that loading the capacitance from the output signal of the MEMS capacitive sensor may not be necessary.

DETAILED DESCRIPTION OF ILLUSTRATIVE EMBODIMENTS

The present MEMS capacitive sensor and the arrangement for amplifying an output signal of the MEMS capacitive sensor will now be described in more detail hereinafter with reference to the accompanying drawings showing different embodiments of the sensor and the arrangement. The sensor and the arrangement may, however, be embodied in many different forms and should not be construed as limited to the embodiments set forth herein; rather, these embodiments are provided so that the disclosure will fully convey the scope of the MEMS capacitive sensor and the arrangement for amplifying an output signal of the MEMS capacitive sensor to those skilled in the art.

Figure 1A:
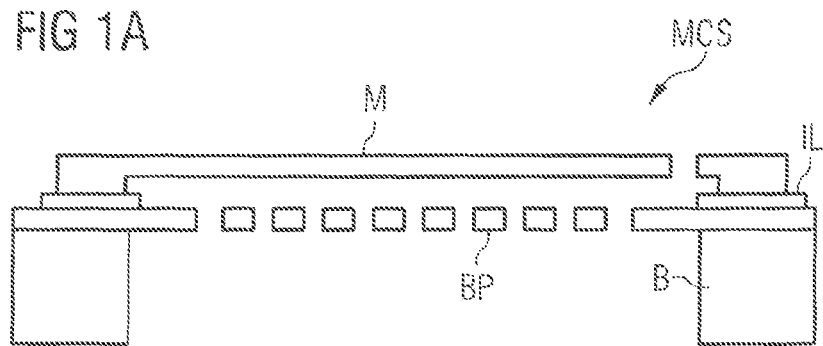
FIG. 1A shows an embodiment of a MEMS capacitive sensor having a capacitor with a variable capacitance.

FIG. 1A shows a structure of a MEMS capacitive sensor MCS comprising a bulk/substrate B that can be made of bulk silicon which is used as a supporting element for supporting a backplate BP and a membrane M. The arrangement of the backplate BP and the membrane M forms a capacitor $C_{MEMS}$. The backplate BP may be configured as a perforated plate. An air gap is provided between the perforated backplate BP and the membrane M. In dependence on an acoustic pressure being effective on the membrane M, a distance between the backplate BP and the membrane M varies so that the capacitance of the capacitor $C_{MEMS}$ formed by the backplate BP and the membrane M also varies. According to the embodiment shown in FIG. 1A, the MEMS capacitive sensor is configured as a MEMS microphone.

Figure 1B:
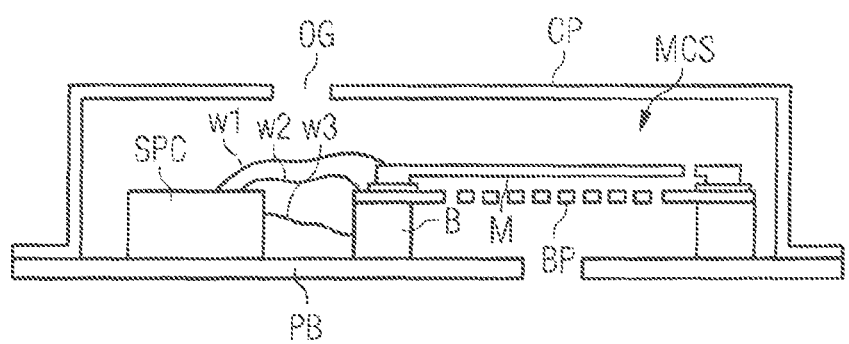
FIG. 1B shows an embodiment of an arrangement for amplifying an output signal of a MEMS capacitive sensor by means of a signal processing circuit.

FIG. 1B shows a MEMS module comprising an arrangement for amplifying an output signal of the MEMS capacitive sensor MCS. The arrangement comprises the MEMS capacitive sensor MCS shown in FIG. 1A which may be configured as a MEMS microphone. The arrangement further comprises a signal processing circuit SPC. The signal processing circuit SPC may be realized as an application-specific integrated circuit (ASIC). The MEMS capacitive sensor MCS and the signal processing circuit SPC are arranged on a supporting plate, for example, a printed circuit board PB. The MEMS capacitive sensor MCS and the signal processing circuit SPC are housed by a cap CP having an opening OG that is used as a sound inlet. The MEMS capacitive sensor is coupled by wires to the signal processing circuit SPC. The connection of the MEMS capacitive sensor MCS with the signal processing circuit SPC is explained in detail below with reference to FIGS. 2 and 3.

Figure 2:
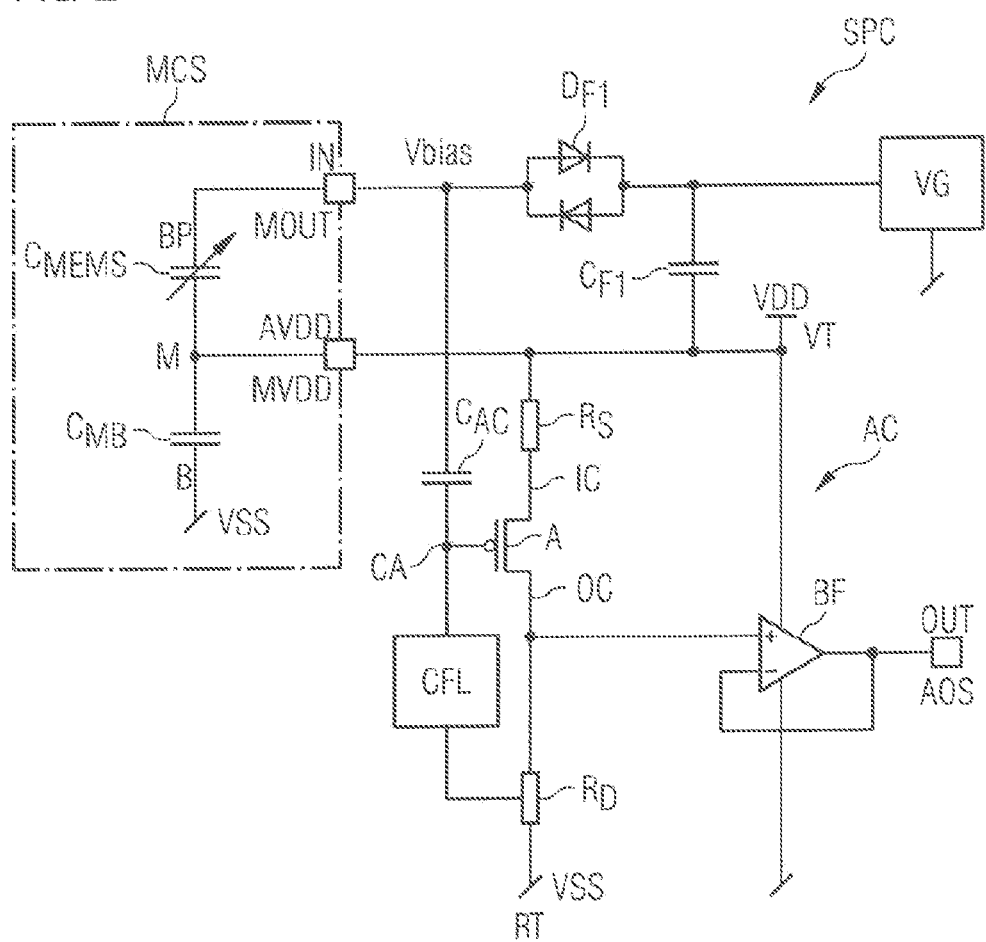
FIG. 2 shows an electrical circuit of an arrangement for amplifying an output signal of a MEMS capacitive sensor by a signal processing circuit.

FIG. 2 shows an embodiment of an arrangement for amplifying the output signal OS of a MEMS capacitive sensor MCS. The MEMS capacitive sensor may be configured as a MEMS microphone comprising the capacitor $C_{MEMS}$ having a variable capacitance. The capacitor $C_{MEMS}$ comprises the backplate BP and the membrane M being separated from each other by a variable distance as shown in FIGS. 1 and 2. In case of the capacitive sensor being configured as a MEMS microphone, the variable distance between the backplate BP and the membrane M is changed in dependence on the acoustic pressure being effective on the surface of the membrane M.

The backplate BP is coupled to an output terminal MOUT of the MEMS capacitive sensor for providing the output signal OS which is generated by the MEMS capacitive sensor in dependence on the change of the capacitance of the capacitor $C_{MEMS}$. The membrane M is coupled to the supply voltage input terminal MVDD of the MEMS capacitive sensor for applying a supply voltage VDD. A MEMS parasitic capacitance $C_{MB}$ is arranged between the membrane M and the bulk/substrate B that is connected to a reference potential VSS.

The MEMS capacitive sensor MCS is coupled to the signal processing circuit SPC via the output terminal MOUT of the MEMS capacitive sensor/the input terminal IN of the signal processing circuit SPC and the supply voltage input terminal MVDD of the MEMS capacitive sensor/the supply voltage output terminal AVDD of the signal processing circuit.

The signal processing circuit comprises a voltage generator VG to provide a bias voltage Vbias for biasing the membrane/backplate of the capacitor $C_{MEMS}$. The voltage generator VG is coupled via a filtering element comprising cross-coupled diodes $D_{F1}$ and a filtering capacitor $C_{F1}$ to the output terminal MOUT of the MEMS capacitive sensor. The signal processing circuit SPC further comprises an internal voltage supply terminal VT to apply the supply voltage VDD. The signal processing circuit SPC provides the supply voltage VDD at the supply voltage output terminal AVDD of the signal processing circuit that is coupled to the supply voltage input terminal MVDD of the MEMS capacitive sensor.

The signal processing circuit SPC further comprises an amplifier circuit AC for amplifying the output signal OS provided from the MEMS capacitive sensor MCS at a signal input terminal IN of the signal processing circuit. The amplifier circuit AC comprises an amplifier A which is connected between an internal supply voltage terminal VT to provide the supply voltage VDD and a reference terminal RT to provide the reference voltage VSS. The amplifier A has a control terminal CA being coupled to the signal input terminal IN via a coupling capacitance $C_{AC}$.

The amplifier A may comprise a transistor, for example, a PMOS transistor. An input connection IC of the amplifier A is connected via a resistor $R_S$ to the internal supply voltage terminal VT to provide the supply voltage VDD. An output connection OC of the amplifier A is connected via a variable resistor $R_D$ to the reference terminal RT to provide the reference voltage VSS. The output connection OC of the amplifier A is coupled via a buffer BF to a signal output terminal OUT of the signal processing circuit. A control circuit CFL is provided in a feedback path of the amplifier A to accelerate the settling of the operation point of the amplifier A.

According to the embodiment of the arrangement for amplifying the output signal OS of the MEMS capacitive sensor MCS shown in FIG. 2, the output signal of the MEMS capacitive sensor is taken from the backplate BP, and the membrane M is connected to a "reference ground" of the amplifier circuit provided at the supply voltage input terminal MVDD of the MEMS capacitive sensor by means of the signal processing circuit SPC. The AC coupling capacitance $C_{AC}$ connected between the signal input terminal IN of the signal processing circuit SPC to receive the output signal OS of the MEMS capacitive sensor at which also the bias voltage Vbias is provided and the control terminal CA of the amplifier A that may be configured as the gate connection GC of the transistor of the amplifier A causes a certain loss of the output signal OS taken from the backplate BP of the capacitor $C_{MEMS}$ to be amplified by the amplifier circuit AC because of an unavoidable parasitic capacitance between the bottom plate of the coupling capacitance $C_{AC}$ to the bulk of the signal processing circuit.

Figure 3:
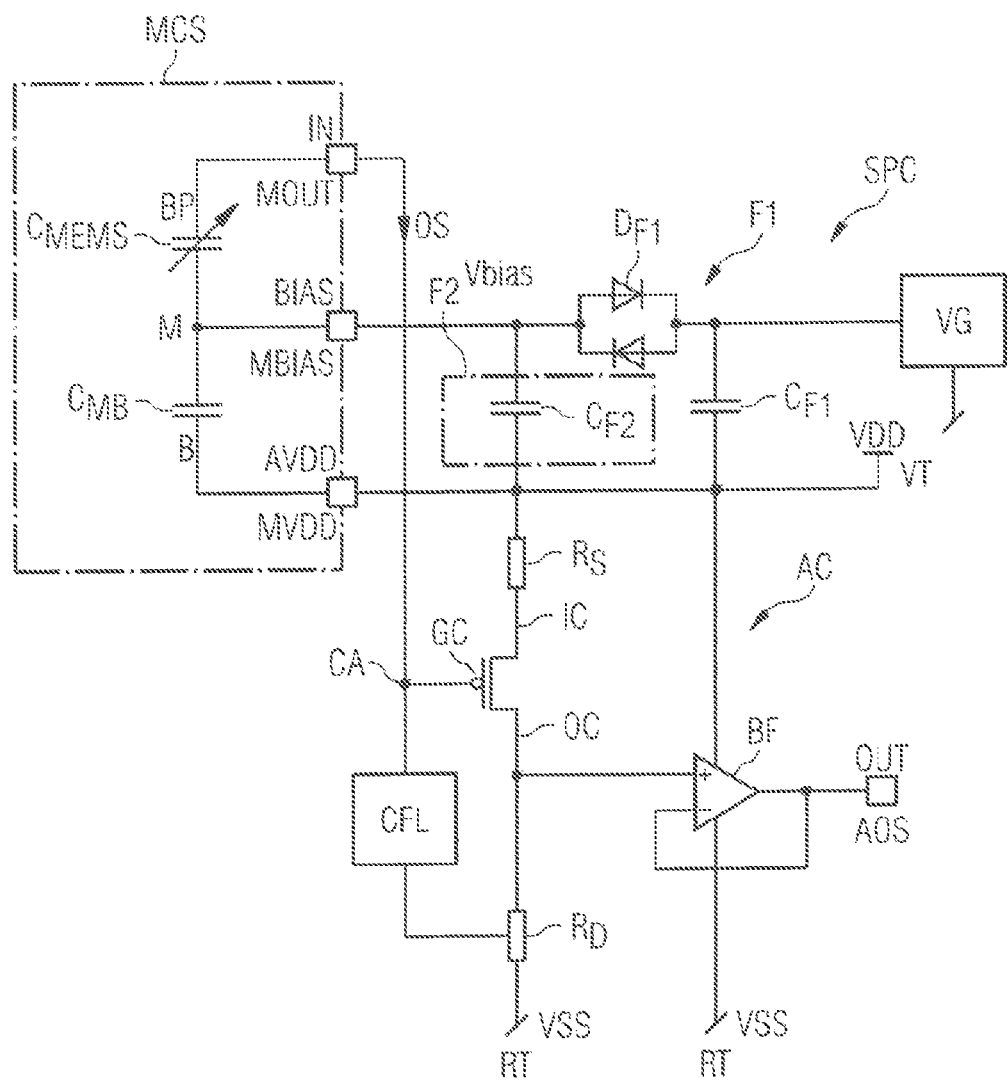
FIG. 3 shows an improved embodiment of an electrical circuit of an arrangement for amplifying an output signal of a MEMS capacitive sensor by means of a signal processing circuit.

FIG. 3 shows an improved embodiment of an arrangement for amplifying an output signal OS of the MEMS capacitive sensor MCS. The MEMS capacitive sensor comprises the capacitor $C_{MEMS}$ having a variable capacitance. The capacitor $C_{MEMS}$ comprises the backplate BP and the membrane M being separated from each other by a variable distance as shown in FIG. 1A. The MEMS capacitive sensor MCS may be configured as a MEMS microphone, wherein the variable distance between the backplate BP and the membrane M may be changed under the influence of any acoustic pressure. The capacitor $C_{MEMS}$ is arranged on a bulk/substrate B of the MEMS capacitive sensor, as shown in FIG. 1A.

The MEMS capacitive sensor MCS comprises an output terminal MOUT to provide the output signal OS. A level of the output signal OS is provided by the MEMS capacitive sensor in dependence on a change of the capacitance of the capacitor $C_{MEMS}$. In the case that the capacitive sensor is configured as MEMS microphone, the capacitance of the MEMS microphone is changed in dependence on any acoustic pressure being effective on the surface of the membrane M. The output terminal MOUT of the MEMS capacitive sensor is connected to the backplate BP of the capacitor $C_{MEMS}$.

The MEMS capacitive sensor MCS further comprises a bias voltage input terminal MBIAS to apply a bias voltage Vbias. The bias voltage input terminal Mbias is connected to the membrane M. The MEMS capacitive sensor further comprises a supply voltage input terminal MVDD to apply a supply voltage VDD. The supply voltage input terminal MVDD is connected to the substrate/bulk B of the MEMS capacitive sensor. A parasitic capacitance $C_{MB}$ of the MEMS capacitive sensor MCS is arranged between the membrane M and the substrate/bulk B. The parasitic capacitance $C_{MB}$ is coupled to the bias voltage input terminal Mbias and the supply voltage input terminal MVDD of the MEMS capacitive sensor. According to an embodiment of the MEMS capacitive sensor, the substrate/bulk B may comprise bulk silicon.

The signal processing circuit SPC for providing the bias voltage Vbias for biasing the capacitor $C_{MEMS}$ and for amplifying the output signal OS of the MEMS capacitive sensor comprises a voltage generator VG to provide the bias voltage Vbias. The voltage generator VG may be configured as a charge pump that is coupled via a filter that may comprise cross-coupled diodes $D_{F1}$ and a capacitor $C_{F1}$ to a bias voltage output terminal BIAS of the signal processing circuit to provide the bias voltage Vbias for the MEMS capacitive sensor. The bias voltage output terminal BIAS of the signal processing circuit is coupled to the bias voltage input terminal MBIAS of the MEMS capacitive sensor MCS.

The signal processing circuit SPC has a supply voltage output terminal AVDD to provide the supply voltage VDD for the MEMS capacitive sensor MCS. The supply voltage VDD may be provided for the signal processing circuit at an internal supply voltage terminal VT. To this purpose, a supply voltage generator which is not shown in FIG. 3 may be coupled to the internal supply voltage terminal VT to provide the supply voltage. The supply voltage output terminal AVDD of the signal processing circuit SPC is connected to the supply voltage input terminal MVDD of the MEMS capacitive sensor MCS.

The signal processing circuit SPC further comprises an amplifier circuit AC to provide an amplified output signal AOS at a signal output terminal OUT. The amplifier circuit AC is configured to provide the amplified output signal AOS by amplifying the output signal OS provided by the MEMS capacitive sensor MCS at the signal input terminal IN of the signal processing circuit. The amplifier circuit AC comprises an amplifier A to amplify the output signal OS and to provide the amplified output signal AOS at the signal output terminal OUT. The amplifier A is arranged between the supply voltage output terminal AVDD and a reference terminal RT to apply a reference voltage VSS.

The signal input terminal IN of the signal processing circuit is configured to receive the output signal OS of the MEMS capacitive sensor MCS. For this purpose, the signal input terminal IN of the signal processing circuit is coupled to the output terminal MOUT of the MEMS capacitive sensor MCS. The amplifier A of the signal processing circuit has a control terminal CA to apply a control signal, i.e., the output signal OS of the MEMS capacitive sensor, to control a conductive path of the amplifier A between the internal supply voltage terminal VT and the reference terminal RT. The control terminal CA of the amplifier A is connected to the signal input terminal IN of the signal processing circuit.

As shown in the embodiment of the signal processing circuit SPC of FIG. 3, the control terminal CA of the amplifier A is directly connected to the signal input terminal IN. In contrast to the embodiment of the signal processing circuit shown in FIG. 2, the control terminal CA of the amplifier A is connected to the signal input terminal IN without providing the coupling capacitance $C_{AC}$ in the signal path between the signal input terminal IN and the control terminal CA of the amplifier A.

The amplifier A of the amplifier circuit AC of the signal processing circuit may comprise a transistor having a gate connection GC. According to this embodiment, the control terminal CA is connected to the gate connection GC or corresponds to the gate connection GC. The transistor of the amplifier A may be configured as a PMOS transistor. The amplifier A may further comprise an input connection IC coupled to the supply voltage output terminal AVDD and an output connection OC coupled to the reference terminal RT and the signal output terminal OUT. The output connection OC may be coupled to the reference terminal RT via a variable resistor $R_D$. The output connection OC of the transistor may be coupled to the signal output terminal OUT via the buffer BF. A control circuit CFL may be provided in a feedback path of the amplifier A between the variable resistor $R_D$ and the control terminal CA of the amplifier A. The control circuit CFL may be configured as a so-called DC servo loop which is used to speed up the settling of the operation point of the amplifier A, especially the transistor.

The signal processing circuit SPC may comprise a capacitor $C_{F2}$ being connected between the bias voltage output terminal BIAS and the supply voltage output terminal AVDD of the signal processing circuit. The capacitor $C_{F2}$ is connected in parallel to the parasitic capacitance $C_{MB}$ of the MEMS capacitive sensor.

In contrast to the embodiment of the arrangement for amplifying the output signal of the MEMS capacitive sensor shown in FIG. 2, the embodiment of the arrangement for amplifying the output signal of the MEMS capacitive sensor shown in FIG. 3 comprises the MEMS capacitive sensor MCS having three pins. One of them is the output terminal MOUT to provide the output signal OS that is coupled to the signal input terminal IN of the signal processing circuit SPC. The MEMS capacitive sensor MCS further comprises the bias voltage input terminal MBIAS to apply the bias voltage Vbias and, as a third terminal, the supply voltage input terminal MVDD to apply the supply voltage VDD.

The membrane M is connected to the bias voltage input terminal MBIAS, and the backplate BP is connected to the output terminal MOUT/the signal input terminal IN of the signal processing circuit. In contrast to the embodiment of the MEMS capacitive sensor MCS shown in FIG. 2, the substrate/bulk B of the MEMS capacitive sensor is connected to the supply voltage input terminal MVDD of the MEMS capacitive sensor MCS/the supply voltage output terminal AVDD of the signal processing circuit SPC to provide the supply voltage VDD. The connection between the MEMS capacitive sensor MCS and the signal processing circuit via three pads is also illustrated in FIG. 1B by the three wire connection of the wires w1, w2 and w3 between the MEMS capacitive sensor MCS and the signal processing circuit SPC as illustrated in FIG. 1B.

By using the embodiment of the MEMS capacitive sensor MCS and the signal processing circuit SPC shown in FIG. 3, the coupling capacitance $C_{AC}$ which is provided in the signal path between the signal input terminal IN and the control terminal CA of the amplifier A of the signal processing circuit of FIG. 2 and which is loaded by the output signal OS from the MEMS capacitive sensor, is now no longer needed with the design of the MEMS capacitive sensor and the signal processing circuit of FIG. 3. The arrangement of the MEMS capacitive sensor MCS and the signal processing circuit SPC of FIG. 3 offers advantages in terms of the SNR performance of the MEMS capacitive sensor, for example, a MEMS microphone, and/or cost reduction of the signal processing circuit.

The same or even better SNR performance in comparison to the SNR performance of the arrangement of FIG. 2 can be achieved with the arrangement of FIG. 3 with a smaller area needed for the signal processing circuit SPC and at lower costs, for example, without using expensive MiM capacitors. Keeping the same area, compared to the embodiment of the arrangement shown in FIG. 2, the SNR can be further improved with the embodiment of the arrangement of the MEMS capacitive sensor and the signal processing circuit of FIG. 3 by using the area devoted to the coupling capacitance $C_{AC}$ in the embodiment of the signal processing circuit of FIG. 2 to increase the filtering capacitance $C_{F2}$ of the signal processing circuit SPC of FIG. 3.

As explained above, according to the design of the arrangement of the MEMS capacitive sensor MCS and the signal processing circuit SPC of FIG. 3, the MEMS parasitic capacitance $C_{MB}$ located between the membrane M and the bulk/substrate B is connected in parallel with the capacitance $C_{F2}$ of the signal processing circuit SPC. If the MEMS capacitive sensor MCS can be designed so that the parasitic capacitance $C_{MB}$ is large, then this can be exploited to either improve the SNR or to reduce the area and the cost of the signal processing circuit SPC.

Furthermore, at the cost of an additional pad, i.e., an additional BIAS pad, the new configuration of the MEMS capacitive sensor MCS and the signal processing circuit SPC shown in FIG. 3 offers a simple method to invert the polarity of the MEMS capacitive sensor, for example, a MEMS microphone, without affecting the topology of the signal processing circuit. The same voltage generator VG/charge pump and the same inverting preamplifier topology as used for the embodiment of the MEMS capacitive sensor MCS and the signal processing circuit SPC of FIG. 2 can be maintained for the embodiment of the arrangement for amplifying the output signal OS of the MEMS capacitive sensor shown in FIG. 3.

The invention claimed is:

1. A MEMS capacitive sensor comprising:
    a capacitor having a variable capacitance, wherein the capacitor comprises a backplate and a membrane being separated from each other by a variable distance, wherein the capacitor is arranged on a substrate;
    an output terminal configured to provide an output signal, wherein the output terminal is connected to the backplate;
    a bias voltage input terminal configured to apply a bias voltage, wherein the bias voltage input terminal is connected to the membrane, and wherein the bias voltage input terminal is different from the output terminal; and
    a supply voltage input terminal configured to apply a supply voltage, wherein the supply voltage input terminal is connected to the substrate,
    wherein the supply voltage input terminal is different from the output terminal and the bias voltage input terminal, and
    wherein the MEMS capacitive sensor is configured to generate a level of the output signal in dependence on the distance between the membrane and the backplate.

2. The MEMS capacitive sensor as claimed in claim 1, further comprising a parasitic capacitance located between the membrane and the substrate.

3. The MEMS capacitive sensor as claimed in claim 2, wherein the parasitic capacitance is coupled to the bias voltage input terminal and the supply voltage input terminal.

4. The MEMS capacitive sensor as claimed in claim 1, wherein the substrate comprises bulk silicon.

5. The MEMS capacitive sensor as claimed in claim 1, wherein the MEMS capacitive sensor is a MEMS microphone.

6. An arrangement for amplifying an output signal of a MEMS capacitive sensor, the arrangement comprising:
    a capacitor having a variable capacitance, wherein the capacitor comprises a backplate and a membrane being separated from each other by a variable distance, wherein the capacitor is arranged on a substrate;
    an output terminal configured to provide an output signal, wherein the output terminal is connected to the backplate, and wherein the MEMS capacitive sensor is configured to generate a level of the output signal in dependence on the distance between the membrane and the backplate;

a bias voltage input terminal configured to apply a bias voltage, wherein the bias voltage input terminal is connected to the membrane, and wherein the bias voltage input terminal is different from the output terminal;

a supply voltage input terminal configured to apply a supply voltage, wherein the supply voltage input terminal is connected to the substrate, wherein the supply voltage input terminal is different from the output terminal and the bias voltage input terminal;

a signal processing circuit having a supply voltage output terminal configured to provide the supply voltage for the MEMS capacitive sensor and a signal output terminal configured to provide an amplified output signal, wherein the supply voltage output terminal of the signal processing circuit is connected to the supply voltage input terminal of the MEMS capacitive sensor, wherein the signal processing circuit comprises an amplifier configured to amplify the output signal of the MEMS capacitive sensor and to provide the amplified output signal at the signal output terminal of the signal processing circuit, and wherein the amplifier of the signal processing circuit is arranged between the supply voltage output terminal and a reference terminal configured to apply a reference voltage.

7. The arrangement as claimed in claim 6,
wherein the signal processing circuit comprises a signal input terminal configured to receive the output signal of the MEMS capacitive sensor,
wherein the signal input terminal of the signal processing circuit is coupled to the output terminal of the MEMS capacitive sensor,
wherein the amplifier of the signal processing circuit has a control terminal to control the amplifier, and
wherein the control terminal of the amplifier of the signal processing circuit is directly connected to the signal input terminal of the signal processing circuit.

8. The arrangement as claimed in claim 7, wherein the amplifier of the signal processing circuit comprises a transistor having a gate connection coupled to the control terminal of the amplifier, an input connection coupled to the supply voltage output terminal of the signal processing circuit and an output connection coupled to the reference terminal and the signal output terminal.

9. The arrangement as claimed in claim 8, wherein the transistor is a PMOS transistor.

10. The arrangement as claimed in claim 6, wherein the signal processing circuit has a bias voltage output terminal configured to provide the bias voltage for the MEMS capacitive sensor, and wherein the bias voltage output terminal of the signal processing circuit is coupled to the bias voltage terminal of the MEMS capacitive sensor.

11. The arrangement as claimed in claim 10, wherein the signal processing circuit comprises a capacitor connected between the bias voltage output terminal and the supply voltage output terminal of the signal processing circuit.

12. The arrangement as claimed in claim 11, wherein the capacitor of the signal processing circuit is connected in parallel to a parasitic capacitance of the MEMS capacitive sensor.

13. The arrangement as claimed in claim 6, further comprising a parasitic capacitance arranged between the membrane and the substrate, wherein the parasitic capacitance is coupled to the bias voltage input terminal and the supply voltage input terminal.

14. The arrangement as claimed in claim 6, wherein the substrate comprises bulk silicon.

15. The arrangement as claimed in claim 6, wherein the MEMS capacitive sensor is a MEMS microphone.

* * * * *